US010370575B2

(12) United States Patent
Ishihara et al.

(10) Patent No.: US 10,370,575 B2
(45) Date of Patent: Aug. 6, 2019

(54) THERMALLY CONDUCTIVE SHEET

(71) Applicant: SHIN-ETSU CHEMICAL CO., LTD., Tokyo (JP)

(72) Inventors: Yasuhisa Ishihara, Annaka (JP); Akihiro Endo, Annaka (JP); Takahiro Maruyama, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 125 days.

(21) Appl. No.: 15/315,149

(22) PCT Filed: May 25, 2015

(86) PCT No.: PCT/JP2015/064859
§ 371 (c)(1),
(2) Date: Nov. 30, 2016

(87) PCT Pub. No.: WO2015/190270
PCT Pub. Date: Dec. 17, 2015

(65) Prior Publication Data
US 2017/0198188 A1  Jul. 13, 2017

(30) Foreign Application Priority Data

Jun. 10, 2014 (JP) ................................ 2014-120029

(51) Int. Cl.
| | |
|---|---|
| C09K 5/14 | (2006.01) |
| C08K 7/18 | (2006.01) |
| C08L 83/04 | (2006.01) |
| H01L 23/36 | (2006.01) |
| H01L 23/373 | (2006.01) |
| H05K 7/20 | (2006.01) |
| C09D 183/04 | (2006.01) |
| C08K 3/22 | (2006.01) |

(52) U.S. Cl.
CPC ............... C09K 5/14 (2013.01); C08K 7/18 (2013.01); C08L 83/04 (2013.01); C09D 183/04 (2013.01); H01L 23/36 (2013.01); H01L 23/373 (2013.01); H01L 23/3735 (2013.01); H01L 23/3737 (2013.01); H05K 7/20 (2013.01); C08K 3/22 (2013.01); C08K 2003/2227 (2013.01); H01L 2924/0002 (2013.01)

(58) Field of Classification Search
CPC ..... C09K 5/14; C09D 183/04; H01L 23/3735; H01L 23/3737; H01L 23/36; H01L 23/373; H01L 2924/0002; C08K 3/22; C08K 2003/2227; C08K 7/18; C08L 83/04; H05K 7/20
USPC .......................................................... 524/437
See application file for complete search history.

(56) References Cited

U.S. PATENT DOCUMENTS

| | | | | |
|---|---|---|---|---|
| 7,547,743 B2 * | 6/2009 | Goto | ....................... | C08L 83/04 524/404 |
| 9,385,063 B2 * | 7/2016 | Ishihara | .............. | H01L 23/3737 |

FOREIGN PATENT DOCUMENTS

| | | | | |
|---|---|---|---|---|
| JP | H01-173514 A | 7/1989 | | |
| JP | H02-41362 A | 2/1990 | | |
| JP | H09-199880 A | 7/1997 | | |
| JP | 2002-003831 A | 1/2002 | | |
| JP | 2007-059877 A | 3/2007 | | |
| JP | 2012-106480 A | 6/2012 | | |
| JP | 2012106480 A * | 6/2012 | ............. | H01L 24/81 |
| JP | 2013-095023 A | 5/2013 | | |
| JP | 2013-147600 A | 8/2013 | | |
| WO | WO-2013171960 A1 * | 11/2013 | ......... | H01L 23/3737 |

OTHER PUBLICATIONS

JP 2012-106480 A, machine translation, JPO Japan Platform for Patent Information (J-PlatPat). (Year: 2012).*
Aug. 4, 2015 Search Report issued in International Patent Application No. PCT/JP2015/064859.

* cited by examiner

Primary Examiner — Josephine L Chang
(74) Attorney, Agent, or Firm — Oliff PLC

(57) ABSTRACT

A thermally conductive sheet including a glass cloth filled with a thermally conductive resin composition, one or both surfaces of the glass cloth being layered with a cured, thermally conductive silicone composition, wherein the thermally conductive silicone composition comprises a silicone component and thermally conductive filler (C) of an amount of 1,200 to 2,000 parts by mass, relative to 100 parts by mass of the silicone component, the thermally conductive filler (C) has an average particle size smaller than 15 μm, and an amount of particles having a particle size of 45 μm or larger is 0 to 3 mass % and an amount of particles having a particle size of 75 μm or larger is 0 to 0.01 mass %, based on an amount of the thermally conductive filler (C).

19 Claims, No Drawings

THERMALLY CONDUCTIVE SHEET

FIELD OF THE INVENTION

The present invention relates to a thermally conductive sheet. Specifically, the present invention relates to a thermally conductive sheet used as a heat transmitting material to be interposed between a heat radiating electronic member and a heat dissipation member, such as a heat sink.

BACKGROUND OF THE INVENTION

Semiconductors such as transistors and diodes used in electronic equipments, such as converters and electrical power sources, need to have high performance, high speed, small size and high integration and, accordingly, generate a large amount of heat. The heat raises a temperature of the equipments and causes a malfunction or destruction. Therefore, many heat dissipation methods and heat dissipation materials to be used in the method have been proposed to be in order to suppress the temperature raise of the semiconductors in operation.

For example, in order to suppress the temperature raise of semiconductors in operation of electronic equipments, a heat sink having a metal plate which has a high thermal conductivity, such as aluminum or copper plates, is used. This heat sink transmits the heat generated in a semiconductor and releases the heat from the surface on account of a difference in a temperature from outside air. Meanwhile, the semiconductor must be electrically isolated from the heat sink and, therefore, a plastic film is interposed between the heat-generating electronic part and the heat sink. However, the thermal conductivity of the plastic film is very low, so that the heat transfer to the heat sink is significantly prevented. In a case where a semiconductor such as a transistor is fixed to the heat sink with a screw, the screw must pierce through the plastic film to cause a hole in the film. Then, the film tears at the hole to loose the insulation property. The lost insulation property is fatal for transistors and diodes.

In order to provide a sheet which has a good thermally conductivity and less tear, a thermally conductive sheet has been developed wherein a glass cloth and a thermally conductive resin are laminated. For instance, Patent Literature 1 describes a thermally conductive sheet wherein silicone rubber comprising boron nitride powder and spherical silica powder as thermally conductive filler is laminated on a glass cloth. A pressure is applied in the preparation of the sheet. To this end, it is necessary to prepare a uncured sheet having an appropriate size and use a press molding machine. Further, the preparation is in a batch manufacture and, therefore, it is impossible to roll up a finished thermally conductive sheet. This is very inefficient in terms of the productivity and the yield. Further, a size of the raw sheet is restricted, so that a molding size is also restricted.

Coating molding is known as a method for continuous molding. For example, one side of a glass cloth is filled with a thermally conductive silicone resin and, then, a thermally conductive silicone rubber layer is formed on the filled glass cloth to continuously prepare a thermally conductive sheet. The coating molding is very efficient because the finished sheet can be continuously rolled up. In addition, although the width of the sheet is restricted depending on a size of a coating apparatus, the length of the sheet is not restricted and the degree of freedom in size in molding is very high, compared to that in the press molding. However, flatness of the surface obtained in the coating molding is poor, compared to that in the press molding, so that a contact thermal resistance is high. Further, a density of the silicone rubber layer is low, because no pressure is applied in the coating molding. Therefore, the coating molding is not suitable as a method for preparing a sheet having a high thermal conductivity.

PRIOR LITERATURE

Patent Literature 1: Japanese Patent Application Laid-Open No. Hei 9-199880/1997

SUMMARY OF THE INVENTION

Problems to be Solved by the Invention

One of the purposes of the present invention is to provide a sheet which is continuously prepared and rolled up by coating molding and has a high thermal conductivity and a high electrical insulation property.

Means to Solve the Problems

The present inventors have made research to solve the aforesaid problems and have found that in a thermally conductive sheet which has a cured coating of a thermally conductive silicone composition on one or both surfaces of a glass cloth filled with a thermally conductive resin composition, if the thermally conductive silicone composition contains the specific amount of a thermally conductive filler having the specific particle size, a highly thermally conductive sheet is prepared by a continuously molding, whereby the aforesaid purposes are attained.

The present invention provides a thermally conductive sheet comprising a glass cloth filled with a thermally conductive resin composition, one or both surfaces of the glass cloth being layered with a cured, thermally conductive silicone composition, wherein the thermally conductive silicone composition comprises a silicone component and thermally conductive filler (C) of an amount of 1,200 to 2,000 parts by mass, relative to 100 parts by mass of the silicone component, the thermally conductive filler (C) has an average particle size smaller than 15 μm, and an amount of particles having a particle size of 45 μm or larger is 0 to 3 mass % and an amount of particles having a particle size of 75 μm or larger is 0 to 0.01 mass %, based on an amount of the thermally conductive filler (C).

Effects of the Invention

The present thermally conductive sheet is continuously prepared by coating molding and rolled up and has a high thermal conductivity and high insulation property.

DETAILED DESCRIPTION OF THE INVENTION

The present sheet has a cured coating of the thermally conductive silicone composition on one or both surfaces of a glass cloth filled with a thermally conductive resin composition.

The aforesaid thermally conductive silicone composition comprises a silicone component and thermally conductive filler (C).

The silicone component may comprise component (A) which will be explained below.

Component (A) is an organopolysiloxane which has the following average compositional formula:

$$R^1_a SiO_{(4-a)/2}$$

wherein $R^1$ is, independently of each other, substituted or unsubstituted, monovalent hydrocarbon group having 1 to 10 carbon atoms, preferably 1 to 8 carbon atoms, and a is 1.90 to 2.05, and has at least two alkenyl groups each bonded to a silicon atom. Component (A) preferably has a polymerization degree of 20 to 12,000, more preferably 50 to 10,000.

Examples of $R^1$ include alkyl groups such as methyl, ethyl, propyl, butyl, pentyl, hexyl, heptyl, octyl, nonyl, decyl and octadecyl groups; cycloalkyl groups such as cyclopentyl and cyclohexyl groups; aryl groups such as phenyl, tolyl, xylyl and naphthyl groups; aralkyl groups such as benzyl, phenethyl and 3-phenylpropyl groups; halogen-substituted alkyl groups such as 3,3,3-trifluoropropyl and 3-chloropropyl groups; and alkenyl groups such as vinyl, allyl, butenyl, pentenyl and hexenyl groups. Component (A) may be oily or gummy.

Component (A) has two or more, preferably three or more, alkenyl groups each bonded to a silicon atom per molecule and is curable via an addition reaction or by a peroxide. The amount of the alkenyl group bonded to a silicon atom is smaller than the aforesaid lower limit, the composition is not cured sufficiently via an addition reaction. The alkenyl group is preferably a vinyl group. The alkenyl group may bond to a silicon atom at the molecular terminal or the other silicone atom. Preferably, at least one alkenyl group bonds to a silicone atom at the terminal.

In the case where the composition is cured via an addition reaction, examples of component (A) include a copolymer of dimethylsiloxane having both molecular terminals capped with trimethylsiloxy groups and methylvinylsiloxane; methylvinylpolysiloxane having both molecular terminals capped with trimethylsiloxy groups; a copolymer of dimethylsiloxane having both molecular terminals capped with trimethylsiloxy groups; methylvinylsiloxane and methylphenylsiloxane; dimethylpolysiloxane having both molecular terminals capped with dimethylvinylsiloxy groups; methylvinylpolysiloxane having both molecular terminals capped with dimethylvinylsiloxy groups; a copolymer of dimethylsiloxane having both molecular terminals capped with dimethylvinylsiloxy groups and methylvinylsiloxane; a copolymer of dimethylsiloxane having both molecular terminals capped with dimethylvinylsiloxane; methylvinylsiloxane and methylphenylsiloxane; and dimethylpolysiloxane having both molecular terminals capped with trivinylsiloxy groups. These compounds may be used single or in combination of two or more of them.

In the case where the composition is cured by a peroxide, examples of component (A) include dimethylpolysiloxane having both molecular terminals capped with dimethylvinylsiloxy groups; dimethylpolysiloxane having both molecular terminals capped with methylphenylvinylsiloxy groups; a copolymer of dimethylsiloxane having both molecular terminals capped with dimethylvinylsiloxy groups and methylphenylsiloxane; a copolymer of dimethylsiloxane having both molecular terminals capped with dimethylvinylsiloxy groups and methylvinylsiloxane; a copolymer of dimethylsiloxane having both molecular terminals capped with trimethylsiloxy groups and methylvinylsiloxane; methyl(3,3,3-trifluoropropyl)polysiloxane having both molecular terminals capped with dimethylvinylsiloxy groups; a copolymer of dimethylsiloxane having both molecular terminals capped with silanol groups and methylvinylsiloxane; and a copolymer of dimethylsiloxane having both molecular terminals capped with silanol groups; methylvinylsiloxane and methylphenylsiloxane. These compounds may be used single or in combination of two or more of them.

In the case where the composition is cured via an addition reaction, organohydrogen polysiloxane is used as curing agent (B) and the reaction is carried out in the presence of a platinum group catalyst. In the case where the composition is cured by a peroxide, an organic peroxide is used as curing agent (B). All of the curing agents and catalyst mentioned above may be those well known in the art.

The thermally conductive silicone composition may further comprise component (D) as described below, as the silicone component.

Component (D) is one or more selected from the following components (D1) and (D2). Component (D) improves wettability of the thermally conductive filler (C) in the silicone composition, so that the amount of the filler in the composition be increased.

Component (D1) is an alkoxysilane represented by the following formula (1):

$$R^2_a R^3_b Si(OR^4)_{4-a-b} \qquad (1)$$

wherein $R^2$ is, independently of each other, an alkyl group having 6 to 15 carbon atoms, $R^3$ is, independently of each other, a substituted or unsubstituted, monovalent hydrocarbon group having 1 to 12 carbon atoms, $R^4$ is, independently of each other, an alkyl group having 1 to 6 carbon atoms, a is an integer of from 1 to 3, b is an integer of from 0 to 2, provided that a total of a and b is 1 to 3.

In the formula (1), examples of the alkyl group represented by $R^2$ include a hexyl group, an octyl group, a nonyl group, a decyl group, a dodecyl group and a tetradecyl group. Because the number of carbon atoms of the alkyl group represented by $R^2$ is 6 to 15, the wettability of the thermally conductive filler (C) in the silicone composition is improved, so that the thermally conductive filler is easily incorporated in the thermally conductive silicone composition and low temperature properties of the composition become better.

Examples of the substituted or unsubstituted, monovalent hydrocarbon group represented by $R^3$ include alkyl groups such as a methyl group, an ethyl group, a propyl group, an isopropyl group, a butyl group, an isobutyl group, a tert-butyl group, a pentyl group, a neopentyl group, a hexyl group, a heptyl group, an octyl group, a nonyl group, a decyl group and a dodecyl group; cycloalkyl groups such as a cyclopentyl group, a cyclohexyl group and a cycloheptyl group; aryl groups such as a phenyl group, a tolyl group, a xylyl group, a naphthyl group and a biphenylyl group; aralkyl groups such as a benzyl group, a phenylethyl group, a phenylpropyl group and a methyl benzyl group; and those hydrocarbon groups wherein a part or all of the hydrogen atoms of these groups are substituted with a substituent such as a halogen atom such as a fluorine atom, a chlorine atom and a bromine atom or a cyano group, for instance, a chloromethyl group, a 2-bromoethyl group, a 3-chloropropyl group, a 3,3,3-trifluoropropyl group, a chlorophenyl group, a fluorophenyl group, a cyanoethyl group, and a 3,3,4,4,5,5,6,6,6-nonafluorohexyl group. $R^3$ preferably has 1 to 10 carbon atoms, further preferably 1 to 6 carbon atoms. In particular, $R^3$ is a substituted or unsubstituted, alkyl groups having 1 to 3 carbon atoms such as a methyl group, an ethyl group, a propyl group, a chloromethyl group, a bromoethyl group, a 3,3,3-trifluoropropyl group and a cyanoethyl group; or substituted or unsubstituted phenyl groups such as a phenyl group, a chlorophenyl group and a fluorophenyl group.

Examples of the alkyl group represented by $R^4$ include alkyl groups having 1 to 6 carbon atoms, such as a methyl group, an ethyl group, a propyl group, a butyl group, a pentyl group and a hexyl group.

Component (D2) is a dimethylpolysiloxane whose one terminal is capped with a trialkoxysilyl group and which is represented by the following formula (2):

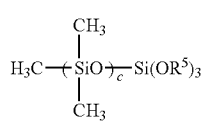

(2)

wherein $R^5$ is, independently of each other, an alkyl group having 1 to 6 carbon atoms and c is an integer of from 5 to 100. The alkyl group represented by $R^5$ is selected from the alkyl groups as defined for $R^4$ in the aforesaid formula (1).

The thermally conductive silicone composition may further comprise the following component (E) as a silicone component. Component (E) is a plasticizer and a dimethylsiloxane represented by the following formula (4):

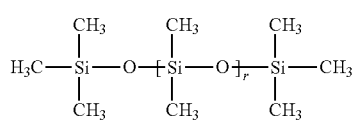

(4)

wherein r is an integer of from 5 to 500.

Thermally conductive filler (C) may be those commonly used. Examples of thermally conductive filler (C) includes non-magnetic metals such as copper and aluminum; metal oxides such as alumina, silica, magnesia, red iron oxide, beryllia, titania and zirconia; metal nitrides such as aluminum nitride, silicon nitride and boron nitride; metal hydroxides such as magnesium hydroxide; artificial diamond, and silicon carbide. These may be used single or in combination of two or more of them.

The thermally conductive filler (C) has an average particle size of less than 15 μm, preferably less than 10 μm. An amount of particles having a particle size of 45 μm or larger is 0 to 3 mass %, preferably 0 to 2.5 mass %, based on an amount of the thermally conductive filler (C). An amount of particles having a particle size of 75 μm or larger is 0 to 0.01 mass %, preferably 0 mass %, based on an amount of the thermally conductive filler (C). If even any one of the amount of particles having a particle size of 45 μm or larger and the amount of particles having a particle size of 75 μm or larger is larger than the aforesaid upper limit, the filler may protrude from a surface of a thermally conductive sheet coated with the thermally conductive silicone composition, the surface of the sheet will be less smooth and, therefore, the thermal contact resistance may be larger in molding. This is disadvantageous in terms of thermal conductivity.

The thermally conductive filler (C) is preferably alumina, comprehensively in terms of thermal conductivity, electrical insulation and a price. In particular, the thermally conductive filler consists preferably of alumina (C1) which has an average particle size of at least 0.1 μm and smaller than 5 μm, preferably at least 0.5 μm and smaller than 2 μm, wherein an amount of particles having a particle size of 45 μm or larger is 0 to 3 mass % and an amount of particles having a particle size of 75 μm or larger is 0 to 0.01 mass %; and alumina (C2) which has an average particle size of at least 5 μm and smaller than 15 μm, preferably at least 5 μm and smaller than 10 μm, wherein an amount of particles having a particle size of 45 μm or larger is 0 to 3 mass % and an amount of particles having a particle size of 75 μm or larger is 0 to 0.01 mass %, and the amount of component (C1) is 20 to 50 mass %, preferably 20 to 40 mass %, and the amount of component (C2) is 50 to 80 mass %, preferably 60 to 80 mass %, relative a total amount of (C1) and (C2).

The thermally conductive filler (C) is preferably spherical in order to provide a smooth surface of the thermally conductive sheet. In particular, when the filler having a large average particle size such as at least 5 μm and smaller than 15 μm, e.g. the aforesaid component (C2), is spherical, the surface of the thermally conductive sheet can be smoother.

The average particle size in the present invention may be determined, on a volumetric basis, with a laser diffraction-scattering particle size distribution analyzer, Microtrac MT3300EX, ex Nikkiso Co., Ltd.

The amount of particles having a particle size of 45 μm or larger and the amount particles having a particle size of 75 μm or larger are determined according to the following manner.

10 Grams of the filler are put in a proper amount of water and dispersed with ultrasonic. A sieve having an opening of 75 μm is laid on a sieve having an opening of 45 μm and set in a sieve shaker. The filler dispersed in water is put on the sieves. The filler remaining on each sieve is dried and weighed.

The amount of component (C) is 1200 to 2000 parts by mass, preferably 1200 to 1600 parts by mass, relative to a total 100 parts by mass of the silicone components. If the amount of the filler is less than the lower limit, sufficient thermal conductivity is not obtained. If the amount of the filler is larger than the upper limit, it is difficult to incorporate the filler in the silicone; and, even if the filler is incorporated in the silicone, the density of the filler is too high, so that the smoothness of the surface of the thermally conductive sheet coated with the composition is poor and, accordingly, the thermal resistance may be larger. The total amount of the silicone components means the total amount of component (A) and, if present component (D), component (E) and the organohydrogenpolysiloxane as curing agent (B).

The amount of component (D) is preferably 0.01 to 60 mass %, further preferably 5 to 50 mass %, based on a total mass of the silicone components. If the amount of component (D) is less than the lower limit, it might be sometime difficult to incorporate the thermally conductive filler (C) in the silicone components. If the amount is larger than the upper limit, a hardness of the cured product may be insufficient.

The amount of component (E) is preferably 5 to 25 mass %, based on a total mass of the silicone components.

The cured thermally conductive silicone composition preferably has a thermal conductivity of 3.0 W/m·K or larger. A hardness of the cured thermally conductive silicone composition is preferably 60 to 96, further preferably 80 to 96, as determined by a type A durometer. If the hardness is too low, the surface of the cured product scratches easily during handling and the surfaces of the cured product may adhere to each other when the sheet is rolled up in continuous molding. If the hardness is low, when the present thermally conductive sheet is fixed by a screw between a heat generating portion and a cooling portion of an electronic device, the sheet is deformed by a pressure exerted by the screw so that it is difficult to secure a space between the heat generating portion and the cooling portion and, as a result, it is difficult to secure an insulation property. If the hardness is too high, flexibility of the sheet is poor and, therefore, cracks may occur when the sheet is bent.

The present thermally conductive sheet has the thermally conductive cured coating on one or both surfaces of the glass cloth which is filled with the thermally conductive resin composition. The glass cloth may be commercially available one. For instance, a glass cloth having a weight of 30 g/m$^2$ or less may be used. A thickness of the glass cloth is preferably 60 μm or less, further preferably 30 to 50 μm, further preferably 30 to 45 μm. The glass cloth has a comparatively low thermal conductivity. Therefore, when a high thermal conductivity is desired, a thin glass cloth is preferable. However, the thickness of the glass cloth is too small, the mechanical strength of the glass cloth decreases.

The thermally conductive resin composition for filling the glass cloth preferably has a thermal conductivity of 1.2 W/mK or larger.

The thermally conductive resin composition for filling the glass cloth may be, for instance, a composition comprising a thermally curable resin and a thermally conductive filler, and includes a composition comprising the aforesaid components (A) to (C) mentioned above for the thermally conductive silicone composition for a thermally conductive cured coating. The amount of the thermally conductive filler (C) is preferably 200 to 2000 parts by mass, relative to a total 100 parts by mass of the silicone components. If the amount of the filler is less than the lower limit, it is difficult to provide the thermal conductivity of 1.2 W/mK or larger to the material for filling. The particle size of the thermally conductive filler (C) may not be limited. The thermally conductive resin composition for filling may be the same as the afore-mentioned thermally conductive silicone composition for the thermally conductive cured coating.

The glass cloth is filled so as to provide a filled glass cloth sheet, which has a thickness of 100 μm or less, preferably 90 μm or less, further preferably 85 μm or less. If the thickness of the filled glass cloth sheet is too large, the thickness of the thermally conductive cured coating is too small, provided that the thermally conductive sheet has a prescribed thickness, so that the thermal conductivity of the thermally conductive sheet is too small. The thickness of the thermally conductive sheet is preferably 200 μm or more in order to secure the insulation property. When the thickness of the thermally conductive sheet is 200 μm, if the thickness of the filled glass cloth sheet is 100 μm or more, the thickness of each of the thermally conductive cured coatings present on the both surfaces of the glass sheet is less than 50 μm. Then, the thermally conductive filler contained in the thermally conductive cured coating may protrude from the surface of the coating, the surface of the sheet will be less smooth and, therefore, the thermal conductivity decreases.

The present thermally conductive sheet is prepared by applying the aforesaid thermally conductive silicone composition on one or both surfaces of the filled glass cloth sheet and curing the composition to form a cured coating, as will be explained below in detail. Applying the composition is carried out so as to attain a thickness of a cured coating of 50 to 400 μm, preferably 60 to 350 μm. As afore-mentioned, if the thickness of the cured coating is too small, the thermally conductive filler contained in the thermally conductive cured coating may protrude from the surface of the coating, so that the surface of the thermally conductive cured coating will be less the smooth. A total thickness of the thermally conductive sheet which has the thermally conductive cured coatings on the both surfaces of the filled glass cloth is preferably 130 to 900 μm, further preferably 150 to 800 μm. A total thickness of the thermally conductive sheet which has the thermally conductive cured coating on the one surface of the filled glass cloth is preferably 80 to 500 μm, further preferably 90 to 450 μm.

The aforesaid thermally conductive silicone composition is prepared in the following manner. Components (A) and (C) and the optional components (D) and (E) are kneaded with a kneader or a mixer such as a banbury mixer, a planetary mixer and a Shinagawa mixer, if needed, with heating at 100 degrees C. or higher. In this kneading step, if desired, a reinforcing silica such as fumed silica and precipitated silica; a silicone oil; a silicone wetter; or a flame retardant such as platinum, titanium oxide and benzotriazole may be added as long as the thermal conductivity is not impaired. The uniform composition prepared in the kneading step is cooled to room temperature, filtered through a strainer or the like and, then, the required amount of curing agent (B) is added to the mixture obtained, kneaded again with two rolls or a Shinagawa mixer. In the second kneading step, if desired, an acetylene compound type of an addition reaction retarder such as 1-ethynyl-1-cyclohexanol, colorants such as organic pigments and inorganic pigments, heat resistance improving agents such as iron oxide and cerium oxide, or an inner release agent may be added. The thermally conductive silicone composition obtained may be used directly in a next step as a coating material or may be given a solvent such as toluene if needed.

In a case where the thermally conductive silicone composition obtained is used as a filling material, the composition is continuously applied on the glass cloth with a conventional coating equipment such as a comma coater, a knife coater and a kiss coater which are equipped with a drying furnace, a heating furnace and a winding device and, then, the solvent is evaporated. When the composition is cured via an addition reaction, the composition applied is heated at 80 to 200 degrees C., preferably 100 to 150 degrees C. to prepare the filled glass cloth. When the composition is cured by the peroxide, the composition applied is heated at 100 to 200 degrees C., preferably 110 to 180 degrees C. to prepare the filled glass cloth.

The present thermally conductive sheet is continuously prepared by applying the aforesaid thermally conductive silicone composition on one or both surfaces of the filled glass cloth sheet and curing the composition to form a cured coating. For instance, the thermally conductive silicone composition obtained is continuously applied on the one surface of filled glass cloth with a conventional coating equipment such as a comma coater, a knife coater and a kiss coater which are equipped with a drying furnace, a heating furnace and a winding device and, then, the solvent is evaporated. When the composition is cured via an addition reaction, the composition applied is heated at 80 to 200 degrees C., preferably 100 to 150 degrees C. to form a thermally conductive cured coating. When the composition is cured by the peroxide, the composition applied is heated at 100 to 200 degrees C., preferably 110 to 180 degrees C. to form a thermally conductive cured coating. In the case where the both surfaces of the filled glass cloth are to be coated, the another thermally conductive cured coating is formed on the other surface of the filled glass cloth in the same manner as that for coating one surface of the thermally conductive sheet. The both surfaces may be coated in one step. The thermally conductive sheet obtained is continuously rolled up. The thermally conductive silicone composition for coating one surface may be the same as or different from the thermally conductive silicone composition for coating the other surface.

Preferably, the present thermally conductive sheet with a total thickness of 0.2 mm has a thermal resistance of 1.8 cm²·K/W or less, as determined according to the ASTM D5470 standards and a dielectric breakdown voltage of 6 kV or higher, as determined according to the Japanese Industrial Standards (JIS) K 6249. The thermal resistance and the dielectric breakdown voltage is approximately proportional to a thickness of the thermally conductive sheet.

EXAMPLES

The present invention will be explained in detail with reference to the following Examples, but not limited to them.

The materials used in Examples and Comparative Examples are as follows.

Component (A):
(A-1) Dimethylpolysiloxane whose both terminals are capped each with a dimethylvinyl group and has an average polymerization degree of 8000.
(A-2) Dimethylpolysiloxane whose both terminals are capped each with a dimethylvinyl group and has an average polymerization degree of 3000.

Component (B): 2-methylbenzoyl peroxide

Component (C):
(C-1) Amorphous alumina which has an average particle size of 1 μm and comprises at most 3 mass % of particles having a particle size of 45 μm or larger and no particles having a particle size of 75 μm or larger
(C-2) Spherical alumina which has an average particle size of 10 μm and comprises at most 3 mass % of particles having a particle size of 45 μm or larger and no particles having a particle size of 75 μm or larger
(C-3) (Comparative) Spherical alumina which has an average particle size of 10 μm and comprises at most 10 mass % of particles having a particle size of 45 μm or larger and 3 mass % of particles having a particle size of 75 μm or larger
(C-4) (Comparative) Amorphous alumina which has an average particle size of 20 μm and comprises at most 3 mass % of particles having a particle size of 45 μm or larger and no particles having a particle size of 75 μm or larger
(C-5) Crushed zinc oxide which has an average particle size of 1 μm and whose comprises at most 3 mass % of particles having a particle size of 45 μm or larger and no particles having a particle size of 75 μm or larger Component (D): dimethylpolysiloxane whose one terminal is capped with a trimethoxysilyl group, and which has an average polymerization degree of 30 and is represented by the following formula (3).

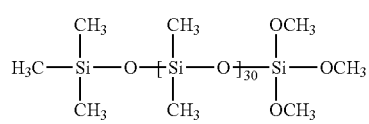

(3)

Component (E): dimethylpolysiloxane represented by the following formula (4):

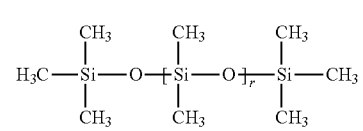

(4)

wherein r is 300.

Glass cloth having a thickness of 40 μm and a weight of 26 g/m²

Examples 1 to 4 and Comparative Examples 1 to 5

[Preparation of a Thermally Conductive Silicone Composition]

The components were added into a Banbury mixer in the amount in parts by mass shown in the following Table 1. The components were kneaded for 20 minutes to prepare thermally conductive silicone compositions (A) to (F).

Each of the silicone composition was cured and its thermal conductivity and a hardness were determined according to the following methods. The results are as shown in the Table 1.

Thermal Conductivity

The silicone composition obtained was poured into a mold having a size of 60×60×6 mm and press-molded at 160 degree C. for 10 minutes at a pressure set so as to obtain a sheet having a thickness of 6 mm after cured. A probe was held between the two sheets and a thermal conductivity of the sheet was determined with a thermal conductivity meter, TPA-501, ex Kyoto Electronics Manufacturing Co., Ltd.

Hardness

The silicone composition obtained was poured into a mold having a size of 60×60×6 mm and press-molded at 160 degree C. for 10 minutes at a pressure set so as to obtain a sheet having a thickness of 6 mm after cured. The two sheets were layered with each other to prepare a test piece. A hardness of the test piece was determined with a durometer type A hardness meter.

[Preparation of a Thermally Conductive Sheet]

Filling a Glass Cloth

The thermally conductive silicone composition was used to fill a glass cloth. That is, toluene was added to the thermally conductive silicone composition in an amount of 20 mass %, based on the amount of thermally conductive silicone composition, and kneaded with a planetary mixer to prepare a coating material. The coating material was applied on one surface of a glass cloth with a comma coater to fill the glass cloth with the material. The comma coater used had a width of 1300 mm and an effective length of an oven of 15 m. The oven was separated into three zones of 5 m, and a temperature in each zone was controllable. A temperature of the zone closest to the comma part was 80 degrees C., a temperature of the middle zone was 150 degrees C., and a temperature of the last zone was 180 degrees C. A coating speed was 2 m per minute. The aforesaid coating material was continuously applied on the surface of the glass cloth and the glass cloth was continuously rolled up to obtain the glass cloth filled with the coating material. The thickness of the glass cloth obtained was 80 μm.

Coating the Glass Cloth Filled with the Coating Material

Toluene was added to the thermally conductive silicone composition in an amount of 20 mass %, based on the amount of thermally conductive silicone composition, and kneaded with a planetary mixer to prepare a coating material. The coating material was applied on one surface of the glass cloth, which had been filled with the coating material in the aforesaid step, with a comma coater so as to provide a thickness of 60 μm after cured and the glass cloth was rolled up. Then, the other surface was coated with the coating material so as to provide a thickness of 60 μm after cured and the glass cloth was rolled up to obtain a thermally conductive sheet which had a total thickness of 200 μm. The comma coater and the coating conditions were same as in the aforesaid process for filling, except Comparative Example 5, where the coating of the glass cloth was conducted in the following manner. A temperature of the zone closest to the comma part was 60 degrees C., a temperature of the middle zone was 80 degrees C., and a temperature of the last zone was 80 degrees C.; a coating speed was 2 m per minute; That is, the temperature of the oven was such that degradation of peroxide (B) did not occur, but toluene was evaporated. On account of the low temperature, an unvulcanized product was obtained. The unvulcanized product was cut to a suitable size, which was press-molded with a compression molding machine at 170 degrees C. for 10 minutes at the pressure set so as to make a thickness 200 μm after cured to obtain a thermally conductive sheet.

A thermal resistance and a dielectric breakdown voltage of the thermally conductive sheet were determined in the following manners. The results are as shown in Table 2.

Thermal Resistance

The thermal resistance was determined according to ASTM D 5470.

Dielectric Breakdown Voltage

The dielectric breakdown voltage was determined according to the Japanese Industrial Standards (JIS) K 6249.

TABLE 1

| | | Composition | | | | | |
|---|---|---|---|---|---|---|---|
| | | A | B | C | D | E | F |
| Component (A) | A-1 | 100 | 70 | 100 | 100 | 100 | 100 |
| | A-2 | 0 | 30 | 0 | 0 | 0 | 0 |
| Component (B) | | 20 | 28 | 30 | 35 | 28 | 20 |
| Component (C) | C-1 | 560 | 560 | 200 | 560 | 560 | 1100 |
| | C-2 | 1680 | 1680 | 600 | 0 | 0 | 2800 |
| | C-3(For comparison) | 0 | 0 | 0 | 1680 | 0 | 0 |
| | C-4(For comparison) | 0 | 0 | 0 | 0 | 1680 | 0 |
| | C-5 | 0 | 50 | 0 | 0 | 0 | 0 |
| Total amount of components (C) | | 2240 | 2290 | 800 | 2240 | 2240 | 3900 |
| Component (D) | | 40 | 35 | 20 | 40 | 20 | 60 |
| Component (E) | | 15 | 10 | 0 | 15 | 10 | 20 |
| Parts by mass of component (C) relative to a total 100 parts by mass of silicone components (A), (D) and (E) | | 1445 | 1579 | 666 | 1445 | 1723 | 2167 |
| Thermal conductivity, W/mK | | 3.3 | 3.3 | 1.4 | 3.5 | 3.7 | 3.7 |
| Hardness, type A durometer | | 90 | 85 | 78 | 90 | 91 | 95 |

TABLE 2

| | | Example | | | | Comparative Example | | | | |
|---|---|---|---|---|---|---|---|---|---|---|
| | | 1 | 2 | 3 | 4 | 1 | 2 | 3 | 4 | 5 |
| Composition for filling | | A | A | C | B | A | A | A | A | A |
| Composition for a thermally conductive coat | One surface | A | A | A | B | C | D | E | F | D |
| | The other surface | A | B | A | B | C | D | E | F | D |
| Thermal resistance, cm² · K/W | | 1.33 | 1.23 | 1.58 | 1.12 | 2.65 | 2.14 | 1.92 | 1.96 | 1.10 |
| Dielectric breakdown voltage, kV | | 9 | 9 | 9 | 9 | 10 | 10 | 10 | 10 | 10 |

The thermally conductive sheets of the present invention were prepared by continuous coating and rolling. As shown in Table 2, the present thermally conductive sheets with a total thickness of 0.2 mm had the low thermal resistance of 1.8 cm²·K/W or smaller and the high dielectric breakdown voltage of 6 kV or larger.

The sheet prepared in Comparative Example 1 comprised the smaller amount of the thermally conductive filler (C), compared to that of the present invention, so that its thermal resistance was larger. In Comparative Example 2 where the amount of particles having a particle size of 45 μm or larger and the amount of particles having a particle size of 75 μm were larger than those of the present invention, the particles having the large particle size protruded from the surface of the sheet so that the surface was less smooth and the thermal resistance increased. In Comparative Example 3 where the average particle size was larger than that of the present invention and Comparative Example 4 where the amount of the filler was larger than that of the present invention, the surface was less smooth and the thermal resistance increased. The sheet in Comparative Example 5 was prepared in the same manner as in Comparative Example 2, except that the press molding was conducted in place of the coating. On account of the press molding, a sheet having a small thermal resistance was obtained. However, in the press molding, it was impossible to continuously prepare the sheet and roll it up.

The invention claimed is:

1. A thermally conductive sheet consisting of
a glass cloth filled with a thermally conductive resin composition, and
a cured thermally conductive silicone composition on one or both surfaces of the glass cloth, wherein
the thermally conductive silicone composition comprises a silicone component and thermally conductive filler (C) of an amount of 1,200 to 2,000 parts by mass, relative to 100 parts by mass of the silicone component,
the thermally conductive filler (C) has an average particle size smaller than 15 μm,
an amount of particles having a particle size of 45 μm or larger is 0 to 3 mass % and an amount of particles having a particle size of 75μm or larger is 0 to 0.01 mass %, based on an amount of the thermally conductive filler (C), and
the cured thermally conductive silicone composition has a hardness of 85 to 96, as determined by a type A durometer.

2. The thermally conductive sheet according to claim 1, wherein the cured thermally conductive silicone composition has a thermal conductivity of 3.0 W/m·K or larger.

3. The thermally conductive sheet according to claim 1, wherein the thermally conductive sheet having a total thickness of 0.2 mm has a thermal resistance of 1.8 cm²·K/W or less, as determined according to the ASTM D5470 standards.

4. The thermally conductive sheet according to claim 1, wherein the thermally conductive sheet having a total thickness of 0.2 mm has a dielectric breakdown voltage of 6 kV or higher, as determined according to the Japanese Industrial Standards (JIS) K 6249.

5. The thermally conductive sheet according to claim 1, wherein a thickness of the glass cloth is 60 μm or smaller in a cross section of the thermally conductive sheet, a thickness of the whole thermally conductive sheet is 130 to 900 μm when the sheet has the cured thermally conductive silicone composition on the both surfaces of the glass cloth, or a thickness of the whole thermally conductive sheet is 80 to 500 μm when the sheet has the cured thermally conductive silicone composition on one surface of the glass cloth.

6. The thermally conductive sheet according to claim 1, wherein the silicone component comprises an organopolysiloxane (A) which has at least two alkenyl groups each bonded to a silicon atom and has the following average compositional formula:

$$R^1_a SiO_{(4-a)/2}$$

wherein $R^1$ is, independently of each other, substituted or unsubstituted, monovalent hydrocarbon group having 1 to 10 carbon atoms and a is 1.90 to 2.05.

7. The thermally conductive sheet according to claim 6, wherein the silicone component further comprises
(D) at least one of the following (D1) or (D2):
(D1) an alkoxy silane represented by the following formula (1):

$$R^2_a R^3_b Si(OR^4)_{4-a-b} \quad (1)$$

wherein $R^2$ is, independently of each other, an alkyl group having 6 to 15 carbon atoms, $R^3$ is, independently of each other, a substituted or unsubstituted, monovalent hydrocarbon group having 1 to 12 carbon atoms, $R^4$ is, independently of each other, an alkyl group having 1 to 6 carbon atoms, a is an integer of from 1 to 3, and b is an integer of from 0 to 2, provided that a total of a and b is 1 to 3; or (D2) a dimethylpolysiloxane in which one terminal is capped with a trialkoxysilyl group and which is represented by the following formula (2):

$$H_3C-\left(\underset{\underset{CH_3}{|}}{\overset{\overset{CH_3}{|}}{Si}}O\right)_{\!\!c}\!\!-Si(OR^5)_3 \quad (2)$$

wherein $R^5$ is, independently of each other, an alkyl group having 1 to 6 carbon atoms and c is an integer of from 5 to 100.

8. The thermally conductive sheet according to claim 7, wherein an amount of component (D) is 0.01 to 60 mass %, based on a total amount of the silicone component.

9. The thermally conductive sheet according to claim 1, wherein the thermally conductive filler (C) consists of 20 to 50 mass % of alumina (C1) which has an average particle size of at least 0.1 μm and smaller than 5 μm, and 50 to 80 mass % of alumina (C2) which has an average particle size of at least 5 μm and smaller than 15 μm.

10. The thermally conductive sheet according to claim 9, wherein component (C2) is spherical alumina.

11. A thermally conductive sheet consisting of
a glass cloth filled with a thermally conductive resin composition, and
a cured, cured thermally conductive silicone composition on one or both surfaces of the glass cloth, wherein
the thermally conductive silicone composition comprises a silicone component and thermally conductive filler (C) of an amount of 1,200 to 2,000 parts by mass, relative to 100 parts by mass of the silicone component,
the thermally conductive filler (C) has an average particle size smaller than 15 μm,
an amount of particles having a particle size of 45 μm or larger is 0 to 3 mass % and an amount of particles having a particle size of 75 μm or larger is 0 to 0.01 mass %, based on an amount of the thermally conductive filler (C), and
the silicone component comprises:
an organopolysiloxane (A) which has at least two alkenyl groups each bonded to a silicon atom and has the following average compositional formula:

$$R^1_a SiO_{(4-a)/2}$$

wherein $R^1$ is, independently of each other, substituted or unsubstituted, monovalent hydrocarbon group having 1 to 10 carbon atoms and a is 1.90 to 2.05; and
(D) at least one of the following (D1) or (D2):
(D1) an alkoxy silane represented by the following formula (1):

$$R^2_a R^3_b Si(OR^4)_{4-a-b} \quad (1)$$

wherein R² is, independently of each other, an alkyl group having 6 to 15 carbon atoms, R³ is, independently of each other, a substituted or unsubstituted, monovalent hydrocarbon group having 1 to 12 carbon atoms, R⁴ is, independently of each other, an alkyl group having 1 to 6 carbon atoms, a is an integer of from 1 to 3, and b is an integer of from 0 to 2, provided that a total of a and b is 1 to 3; or (D2) a dimethylpolysiloxane in which one terminal is capped with a trialkoxysilyl group and which is represented by the following formula (2):

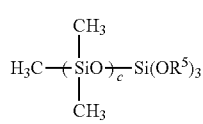

(2)

wherein R⁵ is, independently of each other, an alkyl group having 1 to 6 carbon atoms and c is an integer of from 5 to 100.

12. The thermally conductive sheet according to claim 11, wherein the cured thermally conductive silicone composition has a hardness of 60 to 96, as determined by a type A durometer.

13. The thermally conductive sheet according to claim 11, wherein the cured thermally conductive silicone composition has a thermal conductivity of 3.0 W/m·K or larger.

14. The thermally conductive sheet according to claim 11, wherein the thermally conductive sheet having a total thickness of 0.2 mm has a thermal resistance of 1.8 cm²·K/W or less, as determined according to the ASTM D5470 standards.

15. The thermally conductive sheet according to claim 11, wherein the thermally conductive sheet having a total thickness of 0.2 mm has a dielectric breakdown voltage of 6 kV or higher, as determined according to the Japanese Industrial Standards (JIS) K 6249.

16. The thermally conductive sheet according to claim 11, wherein a thickness of the glass cloth is 60 μm or smaller in a cross section of the thermally conductive sheet, a thickness of the whole thermally conductive sheet is 130 to 900 μm when the sheet has the cured thermally conductive silicone composition on the both surfaces of the glass cloth, or a thickness of the whole thermally conductive sheet is 80 to 500 μm when the sheet has the cured thermally conductive silicone composition on one surface of the glass cloth.

17. The thermally conductive sheet according to claim 11, wherein the thermally conductive filler (C) consists of 20 to 50 mass % of alumina (C1) which has an average particle size of at least 0.1 μm and smaller than 5 μm, and 50 to 80 mass % of alumina (C2) which has an average particle size of at least 5 μm and smaller than 15 μm.

18. The thermally conductive sheet according to claim 17, wherein component (C2) is spherical alumina.

19. The thermally conductive sheet according to claim 11, wherein an amount of component (D) is 0.01 to 60 mass %, based on a total amount of the silicone component.

* * * * *